United States Patent
Herrmann et al.

(10) Patent No.: US 6,351,505 B1
(45) Date of Patent: Feb. 26, 2002

(54) METHOD FOR DETERMINING THE FREQUENCY OF A SIGNAL

(75) Inventors: Franz Herrmann, Opfingen; Manfred Schuster, Illertissen, both of (DE)

(73) Assignee: Daimler-Benz Aerospace AG, München (DE)

( * ) Notice: Subject to any disclaimer, the term of this patent is extended or adjusted under 35 U.S.C. 154(b) by 0 days.

(21) Appl. No.: 09/170,200

(22) Filed: Oct. 13, 1998

(30) Foreign Application Priority Data

Oct. 10, 1997 (DE) ......................................... 197 44 691

(51) Int. Cl.$^7$ ................................................. H04B 1/10
(52) U.S. Cl. ..................................... 375/350; 324/76.28
(58) Field of Search ................................ 375/324, 331, 375/340, 342, 346, 350, 224; 708/300, 309, 311, 322, 400, 403, 404, 405; 324/76.28, 76.29, 76.44, 76.68, 628, 615, 76.11, 76.19; 370/210

(56) References Cited

U.S. PATENT DOCUMENTS

| | | |
|---|---|---|
| 5,291,081 A | 3/1994 | Takeuchi et al. |
| 5,323,391 A * | 6/1994 | Harrison ..................... 370/210 |
| 5,499,391 A | 3/1996 | Tsui |
| 5,629,870 A * | 5/1997 | Farag et al. ........... 364/528.21 |
| 5,657,026 A * | 8/1997 | Culpepper et al. .......... 342/374 |
| 5,939,887 A * | 8/1999 | Schmidt et al. ............. 324/628 |
| 6,229,856 B1 * | 5/2001 | Diab et al. .................. 375/316 |

FOREIGN PATENT DOCUMENTS

SU 873145 10/1981

* cited by examiner

*Primary Examiner*—Chi Pham
*Assistant Examiner*—Bayard Emmanuel
(74) *Attorney, Agent, or Firm*—Venable; Robert Kinberg

(57) ABSTRACT

A method for determining a frequency of a signal includes transforming the analog signal to the complex frequency range through a digital filtering, preferably a FFT, so that result vectors with amplitude and phase components are generated in the frequency range. As a result, a continuous sequence of transformation intervals (FFT intervals) develops within a measuring interval that can be predetermined. Subsequently, pairs of result vectors, which belong to the same predetermined frequency, are selected from predetermined transformation intervals (FFT intervals). Associated phase differences are then formed from which a weighted phase difference is determined. The weighted phase difference is used to correct the signal frequency determined from the amplitude spectrum. This method permits very accurate frequency measuring, especially for pulsed HF signals.

6 Claims, 3 Drawing Sheets

UL 97/15

METHOD FOR DETERMINING THE FREQUENCY OF A SIGNAL

CROSS-REFERENCE TO RELATED APPLICATIONS

Priority is claimed with respect to German application No. 197 44 691.4 filed in Germany on Oct. 10, 1997, the disclosure of which is incorporated herein by reference.

BACKGROUND OF THE INVENTION

The invention is based on a method for determining a frequency of a signal, including converting an electrical signal present in the time domain to a corresponding digitized signal with use of an analog/digital converter; digital filtering the digitized signal for transforming the digitized signal to the frequency domain such that a line spectrum is generated which corresponds to the signal; and determining a signal frequency in the line spectrum from at least one predetermined spectral line belonging to the signal.

For many applications, particularly in the field of measuring technology as well as in electrical engineering, it is necessary to determine at least one frequency for a digitized signal that is present in the time domain, e.g. the frequencies of the underlying individual signals for a modulated signal. For this, the digitized signal is transformed, for example, to the frequency domain, e.g. by means of a complex Discrete Fourier Transformation (DFT) or a complex Fast-Fourier-Transformation (FFT) that is known per se. A line spectrum corresponding to the signal subsequently develops in the frequency domain, which signal can be evaluated in a known way and according to predetermined characteristics. For example, the carrier signal frequency can be determined for a modulated signal, e.g. by determining the position of at least one spectral line on the frequency axis and/or by measuring (frequency) intervals of predetermined spectral line. The accuracies possible with such methods are not sufficient for some application cases.

SUMMARY OF THE INVENTION

It is an object of the invention to improve a method of the type first described above in such a way that a predetermined, frequency measurement with very high accuracy is possible.

The above and other objects are accomplished in the context of the method first described above, wherein the method further includes:

repeating the digital filtering periodically in time, at least within one predetermined measuring interval, so that a temporally continuous sequence of transformation intervals develops within the measuring interval;

carrying out the digital filtering such that in each transformation interval at least one complex result vector (p0 to pn) is created, which has an amplitude component and a phase component (φ);

selecting within the measuring interval, pairs of result vectors (p0, p1), which correspond to the same predetermined spectral line and belong to different, predetermined transformation intervals according to a predetermined pattern;

forming an associated phase difference (Δφ) for each pair of selected result vectors (p0, p1);

determining a frequency F belonging to the selected result vectors from the phase differences (ΔZ) in accordance with the following formula:

$$F = f_{line} + \Delta F_{line} \cdot \frac{1}{2\pi} \cdot \frac{\sum_{i=1}^{n} \Delta\varphi_i}{\sum_{i=1}^{n} \Delta t_i}$$

wherein $\Delta F_{line} = 1/T_{FFT} = 1/$(scanning rate for the analog/digital conversion • the number of scanning values within the transformation interval);

$f_{line}$ = the frequency of the line selected from the amplitude spectrum of a single transformation interval;

$T_{FFT}$ = length in time of the transformation interval;

$\Delta t_i$ = distance in time between selected pairs of result vectors.

A first advantage of the invention is that the method according to the invention for the most part is independent of intended and/or unintended interferences as well as environmental conditions, e.g. another superimposed signal that is nearly identical to the signal to be evaluated.

A second advantage is that the accuracy for determining the exact frequency can be specified, even for pulsed signals.

A third advantage is that the invention can also be used for high-frequency or highest frequency signals.

A fourth advantage is the high aging stability which can be achieved with an arrangement operated in accordance with this method. In addition, such an arrangement advantageously creates a high reproducibility of the measuring results since especially the so-called drifting is avoided.

Further features and advantages of the invention are revealed in the following detailed description.

BRIEF DESCRIPTION OF THE DRAWINGS

The invention is explained in further detail in the following, with the aid of exemplary embodiments and by referring to schematic figures, wherein.

DETAILED DESCRIPTION OF THE INVENTION

According to the invention, an analog, electrical signal that is present in the time domain is initially digitized in a known way, e.g. by means of an analog/digital converter, thereby resulting in so-called scanning values. With high-frequency and highest frequency signals, it may be useful to convert these signals initially in a known way to a predetermined, lower frequency range by means of a mixing operation, e.g. to a so-called intermediate frequency range. The analog signal present in this IF range is then digitized. Such a conversion, for example, is at present standard procedure in radar technology. A time-dependent, periodic sequence of scanning values that can be specified, e.g. respectively for a maximum of 2000, is subsequently converted to the frequency domain through a complex digital filtering that is continuous in time and is known per se, preferably a known, complex wide-band FFT (Fast-Fourier-Transformation). In the FFT, the time duration of such a sequence of scanning values is also called the FFT interval. A complex line spectrum that corresponds to the analog signal is created in this interval, meaning that a (FFT) result vector belongs to each (frequency) line, which result vector is composed of amplitude and phase component values.

Normally an evaluation of the so-called amplitude spectrum in an FFT interval is performed. In this interval, the (frequency) line with the highest amplitude, for example, can be selected initially and its position on the frequency axis can be determined later on. Furthermore, the same evaluation can be carried out for a specified number of FFT intervals that are sequential in time with the evaluation results being subsequently subject to a weighting, e.g. an averaging of the frequency to be determined.

However, a considerably more exact determination of the frequency of a specified line is possible by evaluating the phase components of the result vectors sequence. This is described in further detail in the following.

Figure 1:
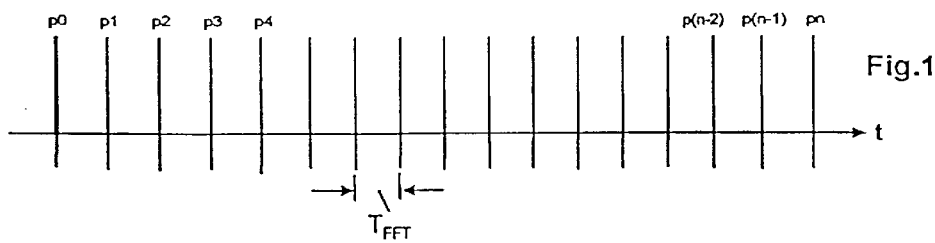
FIGS. 1 to 4 are diagrams for explaining the invention.

FIG. 1 shows a predetermined number of sequential result vectors p0 to pn in a schematic illustration along the time axis t, wherein n is a positive whole number. All result vectors have the same time interval $T_{FFT}$, wherein $T_{FFT}$ refers to the time duration of the FFT interval, and belong to the same frequency, e.g. to the main line (largest amplitude) within the FFT interval. A phase value $\phi_0$ to $\phi_n$ is assigned to each result vector p0 to pn, meaning that the phase value $\phi_0$ belongs to the result vector p0 and the phase value $\phi_1$ belongs to the result vector p1 and so forth. Since all result vectors p1 to pn differ at least slightly, the associated phase values $\phi_0$ to $\phi_n$ are also different. The phase differences $\Delta\phi_i$ are then formed according to the formula:

$$\Delta\phi_i = \phi_i - \phi_{i-1} \quad (1)$$

with $1 \leq i \leq n$.

This results in the desired, exact frequency F, which belongs to the selected line, according to the formula:

$$F = F_{line} + \Delta F_{line} \cdot \frac{1}{2\pi} \cdot \frac{\sum_{i=1}^{n} \Delta\varphi_i}{\sum_{i=1}^{n} \Delta t_i} \quad (2)$$

wherein
$\Delta F_{line} = 1/T_{FFT} = 1/$(scanning rate • number of scanning values within the FFT interval)
$f_{line}$=frequency of the selected line from the amplitude spectrum of a single FFT interval,
$T_{FFT}$=time length of the FFT interval
$\Delta t\Lambda$=distance in time between the result vectors pi and p(i-1).

When summing up these phase differences $\Delta\phi_i$, a corresponding carry-over (multiple of 360 degrees) must be computed in.

It is apparent that the higher the number n of the phase differences $\Delta\phi_i$ the more exact the determination of frequency F on the basis of formulas (1) and (2). Furthermore, it is obvious that an evaluation according to the formulas (1) and (2) requires a considerable computing expenditure (evaluation expenditure), particularly for a high scanning rate (of the A/D converter) and a short FFT interval. Electronic components and/or modules with a high clocking frequency, relative to the analog signal frequency, must be used in that case.

However, other methods can also be used, especially when forming the phase differences $\Delta\phi_i$. This is explained in the following.

Figure 2A:
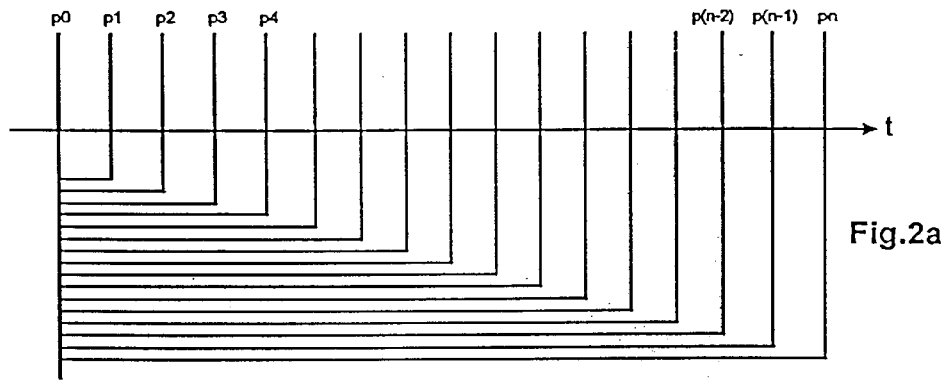
Figure 2B:
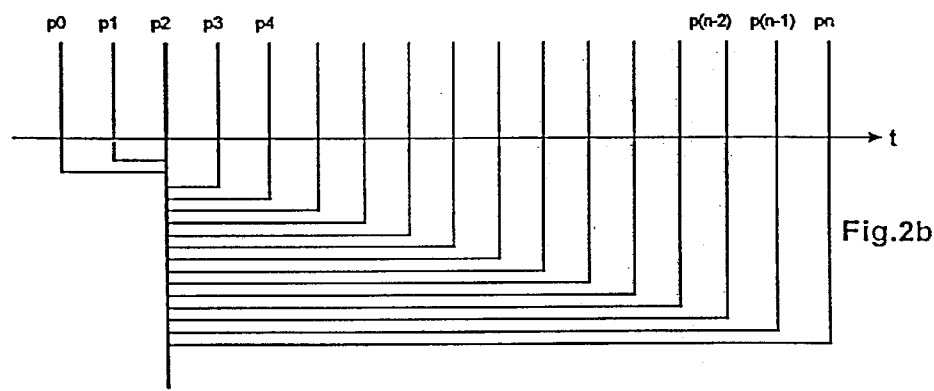
Figure 2C:
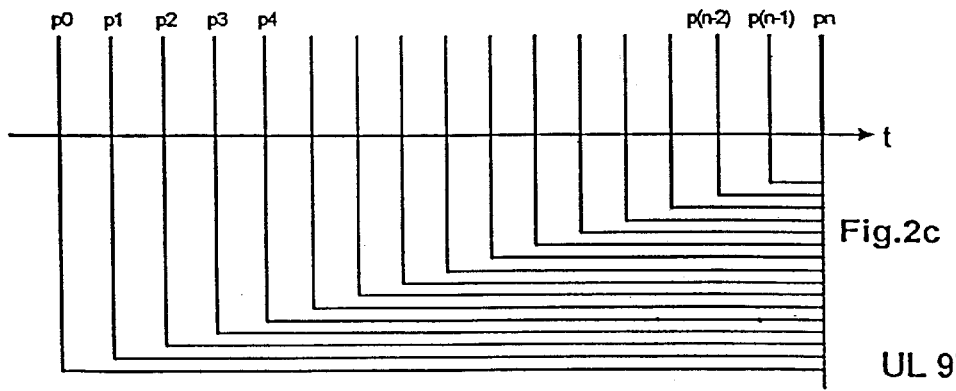

FIGS. 2a to 2c show result vectors p0 to pn in dependence on the time t and corresponding to FIG. 1. In this case, the same FFT interval with the time length $T_{FFT}$ is used. To start with, the initial phase differences $\Delta\phi_i$ are formed according to the following pattern and based on FIG. 2a:

$\Delta\phi_{01} = \phi_0 - \phi_1$, followed by
$\Delta\phi_{02} = \phi_0 - \phi_2$, followed by
$\Delta\phi_{03} = \phi_0 - \phi_3$, and so forth until
$\Delta\phi_{0n} = \phi_0 - \phi_n$.

This is shown in FIG. 2a with connecting lines below the time axis t. The phase differences $\Delta\phi_{01}$ to $\Delta\phi_{0n}$, formed in this way, as well as the associated time differences $\Delta t_{01}$ to $\Delta t_{0n}$ are summed up separately and stored. Subsequently, the phase differences according to FIG. 2b are formed:
$\Delta\phi_{12} = \phi_1 - \phi_2$, followed by
$\Delta\phi_{13} = \phi_1 - \phi_3$, followed by
$\Delta\phi_{14} = \phi_1 - \phi_4$, and so forth until
$\Delta\phi_{1n} = \phi_1 - \phi_n$.

The phase differences $\Delta\phi_{12}$ to $\Delta\phi_{1n}$, formed in this way, as well as the associated time differences $\Delta t_{12}$ to $\Delta t_{1n}$ are also summed up separately and stored, preferably together with the phase sum and time sum, determined according to FIG. 2a. This method is continued until finally the following phase differences are formed according to FIG. 2c:
$\Delta\phi_{n(n-1)} = \phi_n - \phi_{n-1}$, followed by
$\Delta\phi_{n(n-2)} = \phi_n - \phi_{n-2}$, followed by
$\Delta\phi_{n(n-3)} = \phi_n - \phi_{n-3}$, and so forth until
$\Delta\phi_{n1} = \phi_n - \phi_1$.

The phase differences $\Delta\phi_{n(n-1)}$ to $\Delta\phi_{n1}$, formed in this way, as well as the associated time differences $\Delta t_{n(n-1)}$ to $\Delta t_{n1}$ are also summed up separately and stored, preferably along with the already existing phase sums and time sums.

The frequency F is subsequently determined from an evaluation according to formula (2).

An evaluation, described in the above with the aid of FIGS. 2a to 2c, can be carried out advantageously with simple technology and within a short time by means of at least one so-called shift register having a length n, meaning the phase values $\phi_1$ to $\phi_n$, belonging to the result vectors p0 to pn, can initially be input one after another in time (serially) and the phase difference $\Delta\phi_{01}$ to $\Delta\phi_{n1}$ can be formed subsequently by means of a parallel read-out process and can be processed further in the above-described way.

Figure 3:
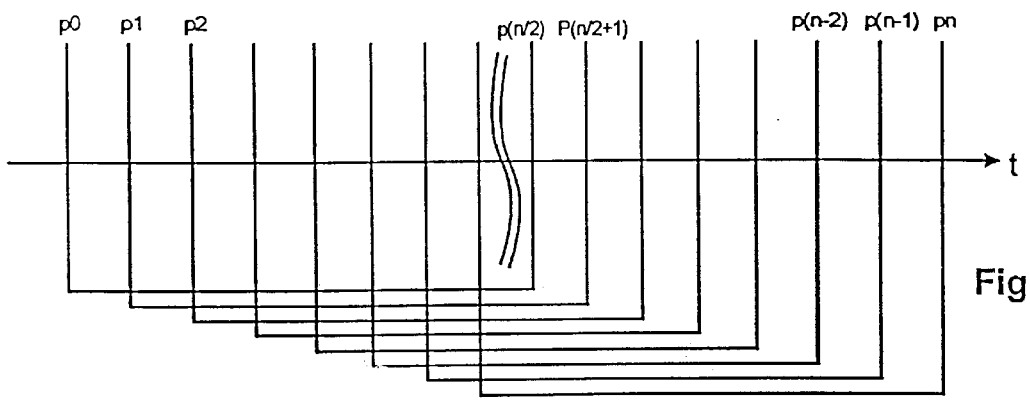

The evaluation procedure according to FIG. 3 differs from that shown in FIGS. 2a to 2c only in that the phase differences $\Delta\phi_i$ are formed according to the following pattern:
$\Delta\phi_{0(n/2)} = \phi_0 - \phi_{n/2}$, followed by
$\Delta\phi_{1(n/2+1)} = \phi_1 - \phi_{n/2+1}$, followed by
$\Delta\phi_{2(n/2+2)} = \phi_2 - \phi_{n/2+2}$, and so forth until
$\Delta\phi_{(n/2-1)n} = \phi_{n/2-1} - \phi_n$, meaning the phase differences are always formed between the phase values $\phi_i$ and $\phi_{i+n/2}$, with $0 \leq i \leq n/2-1$.

Figure 6:
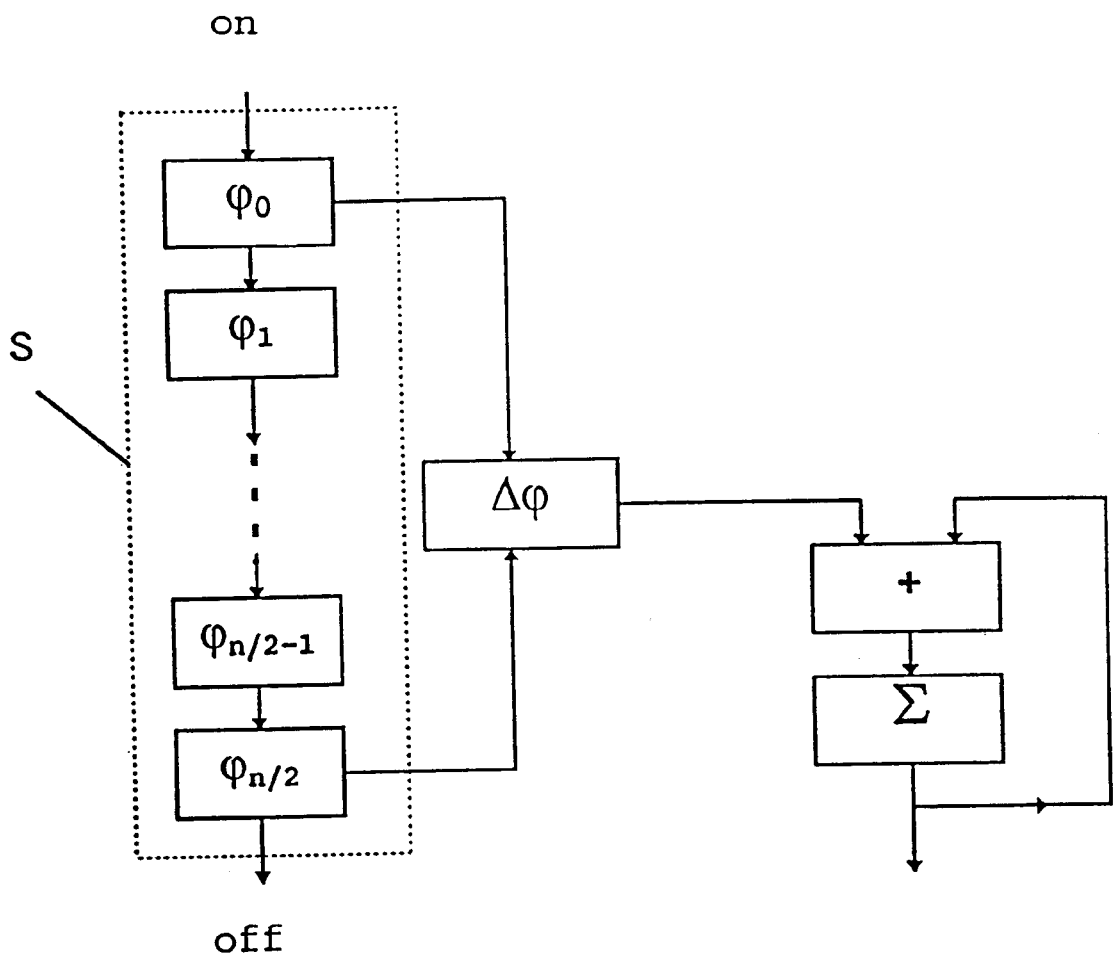
FIG. 6 is a block diagram of an arrangement for carrying out the method according to the invention.

The frequency F is subsequently determined in the manner as described with the aid of FIGS. 2a to 2c. As compared to the method according to FIGS. 2a to 2c, the method according to FIG. 3 has the advantage that only one shift register S (FIG. 6) is required, which has one input "IN" and one output "OUT," as well as the length n/2. In each case, only the first and last phase value, $\phi_0$ and $\phi_{n/2}$ in FIG. 6, must be read out of this shift register because they have the distance n/2. The phase differences $\Delta\phi$ are then formed between these read-out phase values and are evaluated in the previously described way, meaning they are summed up, wherein the carry-over (360 degrees) is taken into account ($\Sigma$,+ in FIG. 6). Thus, only phase differences for half the measuring period (total measuring time=n·$T_{FFT}$) are determined and summed up. This sum must be divided by the number of measured phase differences, multiplied with half the measuring period.

It is particularly advantageous to use the method, described with the aid of FIG. 3, for a determination of the frequency F of a pulsed, high-frequency, coherent analog signal. Such an analog signal, composed of a time-dependent sequence of so-called bursts, is generated, for example, in that a mono-frequency, high-frequency, coherent carrier signal is completely modulated by means of a square-wave signal with nearly optional pulse duty factor. Such an analog HF signal is used, for example, as a transmitting signal for a pulsed radar.

If the carrier signal frequency for such a pulsed, analog signal is to be determined for at least one pulse, for example, it makes sense to perform an evaluation as shown in to FIG. 3. In that case, the scanning rate (of the A/D converter), the time length $T_{FFT}$ of a FFT interval, the number of scanning values contained therein, as well as the number n of the FFT intervals for an associated analog signal, mixed down to a predetermined IF range if necessary, can be selected such that the formula $n \cdot T_{FFT} \leq$ the pulse duration applies. These parameters to be selected depend on the pulse duration, the frequency of the carrier signal, as well as the desired accuracy of the frequency F (formula (2)). It is evident that under these conditions, a single pulse is principally and advantageously sufficient to determine the carrier signal frequency F.

Figure 4:
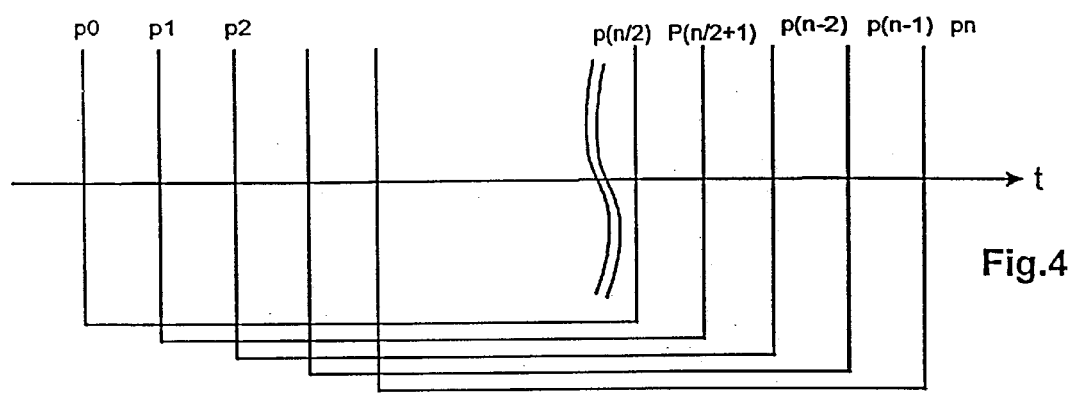

If the pulse length is relatively short and if the frequency must nevertheless be determined with a predetermined high accuracy, it is advantageously possible to determine the frequency F with an evaluation extending over at least two coherent pulses. This is explained with the aid of FIG. 4. The pulses shown therein, pulse 1 and pulse 2, have the same pulse length. This pulse length is selected such that the formula $n/2 \cdot T_{FFT} \leq$ pulse length applies. The interpulse period can have a nearly optional length. The frequency F is then determined as described with the aid of FIG. 3.

Figure 5:
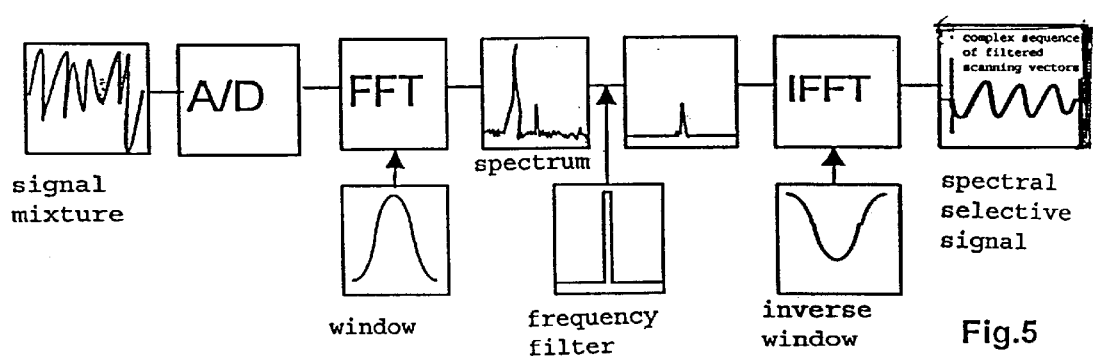
FIG. 5 is a block diagram illustrating a further feature of the invention.

FIG. 5 shows a modification of the invention, which is suitable for determining the Frequency F with a strongly disturbed analog signal (signal mixture). The complex result vectors in this case are formed such that a quickly scanned (A/D converted) real signal is initially transformed in a Fast-Fourier-Transformation (FFT) to the frequency domain by using a complex FFT process, is optionally filtered (all non-desired frequency shares are multiplied with 0) by using a frequency mask (frequency filter), and is subsequently transformed back to the time domain by using an inverse, complex FFT that is adapted to the above FFT. A digital, spectrally selective signal is generated, which consists of a series of filtered complex result vectors (scanning vectors).

The sequence of scanning values, processed in this way, contains a sequence of complex vectors that represent an (optionally) frequency-filtered image of the analog HF signal. This sequence of scanning values can be processed further with a method described with the aid of FIGS. 1 to 4, preferably according to a method as shown in FIG. 3.

This method above all has advantages is pulses or incoming RF signals are "trimmed" or relatively short, meaning that with respect to time they extend only over a maximum of two FFT intervals.

For a pulsed HF signal (e.g. a pulsed carrier signal with a carrier frequency of 0.2 GHz), which is scanned with a scanning frequency of approximately 1 GHz, it is possible with this method to achieve an accuracy (rms) corresponding to the following table. The incoming analog signal in this case is based on a signal to noise ration of 0 dB, and a 64-point FFT is used, that is to say one FFT interval contains 64 scanning values.

| Method according to | one pulse with 1 µs pulse length | 2 pulses with 1 µs pulse length and 100 µs pulse distance | one pulse with 100 µs pulse length |
|---|---|---|---|
| FIG. 1 | 100 kHz | 100 kHz | 1 kHz |
| FIG. 3 | 10 kHz | 60 Hz (FIG. 4) | 4 Hz |
| FIG. 5 | 3 kHz | 10 Hz | 1 Hz |

It is evident that the invention can be used widely in the field of electrical engineering and/or measuring technology to determine a frequency, e.g. when determining the angle of incidence of an electromagnetic wave, wherein the frequency belonging to the wave must be known. Such a method is described in German patent application DE 197 44 692.2 filed Oct. 10, 1997 in Germany and its U.S. counterpart application Ser. No. 09/170,200, filed concurrently on Oct. 10, 1998, the disclosures of which are incorporated herein by reference.

The invention has been described in detail with respect to preferred embodiments, and it will now be apparent from the foregoing to those skilled in the art, the changes and modifications may be made without departing from the invention in its broader aspects, and the invention, therefore, as defined in the appended claims, is intended to cover all such changes and modifications as to fall within the true spirit of the invention.

What is claimed is:

1. A method for determining a frequency of a signal, comprising:

converting an electrical signal present in a time domain to a corresponding digitized signal with use of an analog/digital converter;

digital filtering the digitized signal for transforming the digitized signal to a frequency domain such that a line spectrum is generated which corresponds to the signal;

determining a signal frequency in the line spectrum from at least one predetermined spectral line belonging to the signal;

repeating the digital filtering periodically in time, at least within one predetermined measuring interval, so that a temporally continuous sequence of transformation intervals develops within the measuring interval;

carrying out the digital filtering such that in each transformation interval at least one complex result vector (p0 to pn) is created, which has an amplitude component and a phase component ($\phi$);

selecting within the measuring interval, pairs of result vectors (p0, p1), which correspond to the same predetermined spectral line and belong to different, predetermined transformation intervals according to a predetermined pattern;

forming an associated phase difference ($\Delta\phi$) for each pair of selected result vectors (p0, p1);

determining a frequency F belonging to the selected result vectors from the phase differences ($\Delta\phi$) in accordance with the following formula:

$$F = f_{line} + \Delta F_{line} \cdot \frac{1}{2\pi} \cdot \frac{\sum_{i=1}^{n} \Delta \varphi_i}{\sum_{i=1}^{n} \Delta t_i}$$

wherein $\Delta F_{line}$=1/$T_{FFT}$=1/(scanning rate for the analog/digital conversion • the number of scanning values within the transformation interval);

$f_{line}$=the frequency of the line selected from the amplitude spectrum of a single transformation interval;

$T_{FFT}$=length in time of the transformation interval;

$\Delta t_i$=distance in time between selected pairs of result vectors.

2. A method for determining the frequency of a signal according to claim 1, wherein the digital filtering includes using a complex wide-band Fast-Fourier-Transformation, uninterrupted in time.

3. A method for determining the frequency of a signal according to claim 1, wherein the time interval ($\Delta t_i$) between the selected pairs of result vectors is constant and comprises a predetermined number of transformation intervals.

4. A method for determining the frequency of a signal according to claim 1, wherein the length of time for the measuring interval to determine the frequency of a pulsed HF signal covers at least one pulse.

5. A method for determining the frequency of a signal in accordance with claim 1, wherein the length of time for the measuring interval to determine the frequency of a pulsed HF signal covers at least two pulses, and further including selecting the number of transformation intervals in each pulse to be n/2, wherein n indicates the total number of transformation intervals within the measuring interval.

6. A method for determining a frequency of a signal according to claim 1, wherein the signal is a disturbed analog signal, and the converting step includes initially frequency filtering the disturbed analog signal including:

performing an analog/digital conversion of the signal;

subsequently performing a Fast-Fourier-Transformation of the converted signal;

carrying out a predetermined digital frequency filtering of the Fast-Fourier-Transformation; and carrying out an inverse Fast-Fourier-Transformation so that a sequence of filtered, complex result vectors (Time domain) develop which are used to determine the frequency.

* * * * *